United States Patent
Tanimoto et al.

(10) Patent No.: US 7,855,501 B2
(45) Date of Patent: Dec. 21, 2010

(54) LED WITH PHOSPHOR LAYER HAVING DIFFERENT THICKNESS OR DIFFERENT PHOSPHOR CONCENTRATION

(75) Inventors: Noriyasu Tanimoto, Osaka (JP); Toshifumi Ogata, Osaka (JP); Satoshi Shida, Osaka (JP); Hiroyuki Naito, Osaka (JP)

(73) Assignee: Panasonic Corporation, Osaka (JP)

( * ) Notice: Subject to any disclaimer, the term of this patent is extended or adjusted under 35 U.S.C. 154(b) by 250 days.

(21) Appl. No.: 11/814,349

(22) PCT Filed: May 11, 2006

(86) PCT No.: PCT/JP2006/309875

§ 371 (c)(1),
(2), (4) Date: Jul. 19, 2007

(87) PCT Pub. No.: WO2006/121196

PCT Pub. Date: Nov. 16, 2006

(65) Prior Publication Data

US 2009/0001869 A1  Jan. 1, 2009

(30) Foreign Application Priority Data

May 12, 2005  (JP) .............................. 2005-139916

(51) Int. Cl.
*H01J 1/62* (2006.01)
*H01J 9/00* (2006.01)

(52) U.S. Cl. ......................... 313/501; 313/485; 313/512
(58) Field of Classification Search ................ 313/501, 313/485, 512, 502; 445/58
See application file for complete search history.

(56) References Cited

U.S. PATENT DOCUMENTS

| 6,635,363 | B1 * | 10/2003 | Duclos et al. ............... 313/512 |
| 6,747,406 | B1 | 6/2004 | Bortscheller et al. |
| 2003/0214233 | A1 * | 11/2003 | Takahashi et al. ........... 313/512 |
| 2004/0257797 | A1 * | 12/2004 | Suehiro et al. ................ 362/34 |

FOREIGN PATENT DOCUMENTS

| EP | 1 020 935 | 7/2000 |
| EP | 1 385 216 | 1/2004 |
| JP | 2001-15817 | 1/2001 |

\* cited by examiner

*Primary Examiner*—Nimeshkumar D Patel
*Assistant Examiner*—Jacob Stern
(74) *Attorney, Agent, or Firm*—Hamre, Schumann, Mueller & Larson, P.C.

(57) ABSTRACT

A light-emitting device (1) includes a substrate (10), a light-emitting element (12) that is mounted on the substrate (10) and includes a luminous region (12*b*) and a nonluminous region (12*a*), and a phosphor layer (13) that is formed to cover the light-emitting element (12). The thickness of the phosphor layer (13*a*) located on the nonluminous region (12*a*) is smaller than that of the phosphor layer (13*b*) located on the luminous region (12*b*). The light-emitting device (1) can suppress nonuniform luminescent color.

12 Claims, 13 Drawing Sheets

LED WITH PHOSPHOR LAYER HAVING DIFFERENT THICKNESS OR DIFFERENT PHOSPHOR CONCENTRATION

TECHNICAL FIELD

The present invention relates to a light-emitting device that uses a light-emitting element including luminous and nonluminous regions, a display unit and a lighting unit that use the light-emitting device, and a method for manufacturing the light-emitting device.

BACKGROUND ART

A light-emitting diode (referred to as "LED" in the following) is known as a light-emitting element including a semiconductor multilayer film. In particular, when a LED for emitting blue light such as a GaN LED is combined with a phosphor that emits yellow light by excitation of the blue light, the LED can be applied to a light-emitting device for emitting white light (e.g., JP 2001-15817 A).

FIGS. 12A and 12B show a conventional light-emitting device. FIG. 12A is a schematic top view of the light-emitting device, and FIG. 12B is a cross-sectional view taken along the line I-I in FIG. 12A.

As shown in FIGS. 12A and 12B, a light-emitting device 100 includes a substrate 101, a conductor pattern 102 that is formed on the substrate 101, a LED chip 103 that is flip-chip mounted on the conductor pattern 102, and a phosphor layer 104 that is formed to cover the LED chip 103.

As shown in FIG. 12B, the LED chip 103 includes a sapphire substrate 110 and an n-type semiconductor layer 111, a light-emitting layer 112, and a p-type semiconductor layer 113 that are formed in this order on the sapphire substrate 110. The light-emitting layer 112 is not in contact with a portion 111a of the principle surface of the n-type semiconductor layer 111 that faces the substrate 101, and the portion 111a is provided with an n-side electrode 114a. The n-type semiconductor layer 111 is connected electrically to the conductor pattern 102 via the n-side electrode 114a and a gold bump 115. The p-type semiconductor layer 113 is connected electrically to the conductor pattern 102 via a p-side electrode 114b and a gold bump 115.

When light is produced by the light-emitting device 100 with this configuration, the light emitted from a region of the phosphor layer 104 that is located directly above the portion 111a of the principal surface of the n-type semiconductor layer 111 is not white, but yellow. This is because the optical path length of blue light passing through the phosphor layer 104 located directly above the portion 111a becomes longer, and the phosphor is likely to be excited by the blue light, thus increasing a yellow light component generated from this region. During the emission of light, as shown in FIG. 12A, the upper surface of the phosphor layer 104 includes a region 104a (with hatching) that is located directly above the portion 111a and emits yellow light and a region 104b (without hatching) that emits white light. Thus, the luminescent color of the light-emitting device 100 is not uniform, which can make it difficult to use the device in a lighting unit or a display unit.

DISCLOSURE OF INVENTION

With the foregoing in mind, the present invention provides a light-emitting device that can suppress nonuniform luminescent color, a display unit and a lighting unit that use the light-emitting device, and a method for manufacturing the light-emitting device.

A first light-emitting device of the present invention includes a substrate, a light-emitting element that is mounted on the substrate and includes a luminous region and a nonluminous region, and a phosphor layer that is formed to cover the light-emitting element and includes a phosphor. The thickness of the phosphor layer located on the nonluminous region is smaller than that of the phosphor layer located on the luminous region.

In the context of the present invention, the "phosphor layer located on the nonluminous region" means the phosphor layer formed on a principal surface of the light-emitting element that faces the light extraction side and corresponds to the nonluminous region, and the "phosphor layer located on the luminous region" means the phosphor layer formed on the principle surface of the light-emitting element that faces the light extraction side and corresponds to the luminous region. The same is true in the following description.

A second light-emitting device of the present invention includes a substrate, a light-emitting element that is mounted on the substrate and includes a luminous region and a nonluminous region, and a phosphor layer that is formed to cover the light-emitting element and includes a phosphor. The concentration of the phosphor in the phosphor layer located on the nonluminous region is lower than that of the phosphor in the phosphor layer located on the luminous region.

A display unit and a lighting unit of the present invention include the light-emitting device of the present invention.

A first method for manufacturing a light-emitting device of the present invention is a method for manufacturing a light-emitting device including a substrate, a light-emitting element that is mounted on the substrate and includes a luminous region and a nonluminous region, and a phosphor layer that is formed to cover the light-emitting element by the application of a paste containing a phosphor. The first method includes applying the paste so that the amount of the paste applied per unit area of the nonluminous region is smaller than that of the paste applied per unit area of the luminous region.

A second method for manufacturing a light-emitting device of the present invention is a method for manufacturing a light-emitting device including a substrate, a light-emitting element that is mounted on the substrate and includes a luminous region and a nonluminous region, and a phosphor layer that is formed to cover the light-emitting element by the application of at least two types of pastes containing a phosphor. The second method includes applying a second paste to the nonluminous region and a first paste to the luminous region. The concentration of the phosphor of the second paste is lower than that of the phosphor of the first paste.

BRIEF DESCRIPTION OF DRAWINGS

FIG. 11A shows Comparative Example. FIG. 11B shows Example 1 of the present invention. FIG. 11C shows Example 2 of the present invention.

DESCRIPTION OF THE INVENTION

Figure 1A:
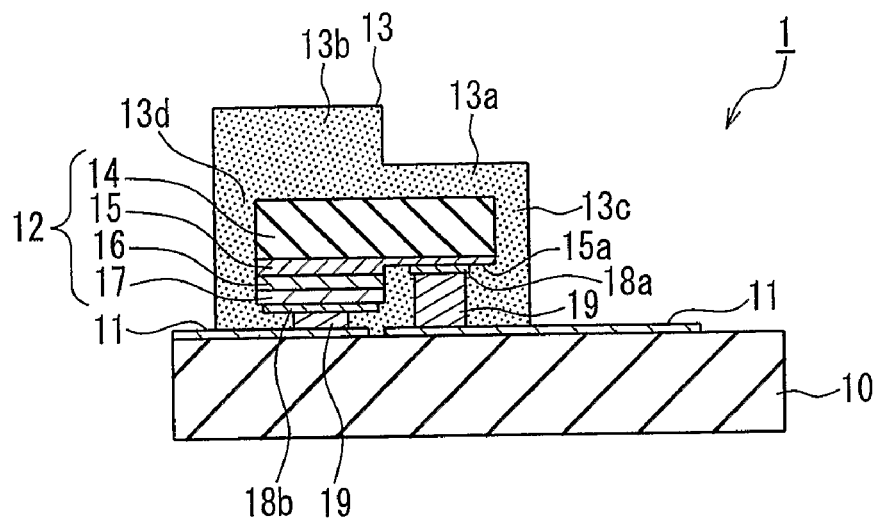
FIG. 1A is a cross-sectional view showing a light-emitting device of Embodiment 1 of the present invention.

The first light-emitting device of the present invention includes a substrate, a light-emitting element mounted on the substrate, and a phosphor layer that is formed to cover the light-emitting element and includes a phosphor.

The base material of the substrate is not particularly limited and may be, e.g., a ceramic material such as $Al_2O_3$ or AlN, a semiconductor material such as Si, or a laminated material in which an electric insulating layer is formed on a metal layer. As the electric insulating layer, e.g., a composite material including 70 to 95 mass % of inorganic filler and 5 to 30 mass % of thermosetting resin composition can be used. The thickness of the base material may be, e.g., 0.1 to 1 mm.

The light-emitting element may have a diode structure of a blue LED. Specifically, a suitable LED chip includes a semiconductor multilayer film in which a first conductivity-type layer, a light-emitting layer, and a second conductivity-type layer are deposited in this order. The "first conductivity-type" indicates p-type or n-type, and the "second conductivity-type" indicates the conductivity type opposite to the first conductivity type. For example, when the first conductivity-type layer is a p-type semiconductor layer, the second conductivity-type layer is an n-type semiconductor layer. The first conductivity-type layer may be, e.g., a p-GaN layer (p-type semiconductor layer) or n-GaN layer (n-type semiconductor layer). As the second conductivity-type layer, e.g., the p-GaN layer (p-type semiconductor layer) or n-GaN layer (n-type semiconductor layer) also can be used. It is preferable to use a material that can emit light having a wavelength of 450 to 470 nm for the light-emitting layer. A specific example of the light-emitting layer may be an InGaN/GaN quantum well light-emitting layer. Moreover, a material that can emit light having a wavelength of not more than 410 nm may be used for the light-emitting layer. The thicknesses of the p-type semiconductor layer, the light-emitting layer, and the n-type semiconductor layer may be, e.g., 0.1 to 0.5 μm, 0.01 to 0.1 μm, and 0.5 to 3 μm, respectively. The light-emitting element may include a single crystal substrate (e.g., with a thickness of about 0.01 to 0.5 mm) such as a sapphire substrate used in crystal growth of the semiconductor multilayer film.

The light-emitting element includes a luminous region and a nonluminous region. The nonluminous region may include, e.g., a region where an electrode is provided. In this case, the "electrode" is arranged on the layer (e.g., the n-type semiconductor layer) that is located on the upper side (i.e., the light extraction side) of the light-emitting layer when it is considered as a reference plane.

The phosphor layer may be obtained by dispersing a phosphor in a matrix resin such as a silicone resin or epoxy resin. Examples of the phosphor include a green light emitting phosphor such as $Y_3(Al, Ga)_5O_{12}:Ce^{3+}$ with a garnet structure or silicate $(Ba, Sr)_2SiO_4:Eu^{2+}$, a yellow light emitting phosphor such as SIALON Ca—Al—Si—O—N:$Eu^{2+}$, silicate $(Sr, Ca)_2SiO_4:Eu^{2+}$, or $(Y, Gd)_3Al_5O_{12}:Ce^{3+}$ with a garnet structure, and red light emitting phosphor such as nitridosilicate $Sr_2Si_5N_8:Eu^{2+}$, nitridoaluminosilicate $CaAlSiN_3$:$Eu^{2+}$, oxo-nitridoaluminosilicate $Sr_2Si_4AlON_7:Eu^{2+}$, or sulfide $CaS:Eu^{2+}$. In particular, when the phosphor layer contains the yellow light emitting phosphor, the light-emitting device can produce white light suitable for a lighting unit.

In the first light-emitting device of the present invention, the thickness of the phosphor layer (referred to as "first phosphor layer" in the following) located on the nonluminous region is smaller than that of the phosphor layer (referred to as "second phosphor layer" in the following) located on the luminous region. This can reduce the amount of light (e.g., blue light) absorbed by the phosphor in the first phosphor layer. Accordingly, the color of light emitted from the first phosphor layer can match the color of light emitted from the second phosphor layer. Thus, the first light-emitting device of the present invention can suppress a nonuniform luminescent color. To ensure the above effect, it is preferable that a value obtained by dividing the thickness of the first phosphor layer by the thickness of the second phosphor layer is ⅓ to ⅔. For example, when the thickness of the first phosphor layer is about 60 to 100 μm, the thickness of the second phosphor layer may be about 100 to 150 μm.

In the first light-emitting device of the present invention, the thickness of a sidewall of the phosphor layer (referred to as "first phosphor wall" in the following) located along the side of the nonluminous region may be smaller than that of a sidewall of the phosphor layer (referred to as "second phosphor wall" in the following) located along the side of the luminous region. This also can suppress the color nonuniformity of light emitted from the sides of the phosphor layer. In this context of the present invention, the "sidewall of the phosphor layer" means the phosphor layer that is in contact with the sides of the light-emitting element. The "thickness of the sidewall of the phosphor layer" means the shortest distance between the surface of the sidewall of the phosphor layer and the side of the light-emitting element. To ensure the above effect, it is preferable that a value obtained by dividing the thickness of the first phosphor wall by the thickness of the second phosphor wall is ⅓ to ⅔. For example, when the thickness of the first phosphor wall is about 60 to 100 μm, the thickness of the second phosphor wall may be about 100 to 150 μm.

Next, the second light-emitting device of the present invention will be described. When the explanation of the second light-emitting device overlaps with that of the first light-emitting device, it may be omitted in the following.

The second light-emitting device of the present invention includes a substrate, a light-emitting element that is mounted on the substrate and includes a luminous region and a nonluminous region, and a phosphor layer that is formed to cover the light-emitting element and includes a phosphor. The materials or the like for each of the components may be the same as those of the first light-emitting device.

In the second light-emitting device of the present invention, the concentration of the phosphor in the phosphor layer (i.e., the first phosphor layer) located on the nonluminous region is lower than that of the phosphor in the phosphor layer (i.e., the second phosphor layer) located on the luminous region. This can reduce the amount of light (e.g., blue light) absorbed by the phosphor in the first phosphor layer. Accordingly, the color of light emitted from the first phosphor layer can match the color of light emitted from the second phosphor layer. Thus, the second light-emitting device of the present invention can suppress nonuniform luminescent color. To ensure the above effect, it is preferable that a value obtained by dividing the concentration of the phosphor in the first phosphor layer by the concentration of the phosphor in the second phosphor layer is 1/3 to 2/3. For example, when the concentration of the phosphor in the first phosphor layer is about 40 to 46 mass %, the concentration of the phosphor in the second phosphor layer may be about 60 to 70 mass %.

In the second light-emitting device of the present invention, the concentration of the phosphor in the sidewall of the phosphor layer (i.e., the first phosphor wall) located along the side of the nonluminous region may be lower than that of the phosphor in the sidewall of the phosphor layer (i.e., the second phosphor wall) located along the side of the luminous region. This also can suppress the color nonuniformity of light emitted from the sides of the phosphor layer. To ensure the above effect, it is preferable that a value obtained by dividing the concentration of the phosphor in the first phosphor wall by the concentration of the phosphor in the second phosphor wall is 1/3 to 2/3. For example, when the concentration of the phosphor in the first phosphor wall is about 40 to 46 mass %, the concentration of the phosphor in the second phosphor wall may be about 60 to 70 mass %.

In the first and second light-emitting devices of the present invention, the light-emitting element may be flip-chip mounted on the substrate. Thus, the light-emitting device can be miniaturized easily.

Next, the display unit and the lighting unit of the present invention will be described. The display unit and the lighting unit include either of the first and second light-emitting devices of the present invention. Therefore, the display unit and the lighting unit can suppress nonuniform luminescent color. Preferred examples of the display unit and the lighting unit of the present invention will be described later.

Next, the first method for manufacturing a light-emitting device of the present invention will be described. The first method is suitable for the manufacture of the first light-emitting device of the present invention. When the explanation of the first method overlaps with that of the first light-emitting device, it may be omitted in the following.

The first method of the present invention is a method for manufacturing a light-emitting device including a substrate, a light-emitting element that is mounted on the substrate and includes a luminous region and a nonluminous region, and a phosphor layer that is formed to cover the light-emitting element by the application of a paste containing a phosphor. The first method includes applying the paste so that the amount of the paste applied per unit area of the nonluminous region is smaller than that of the paste applied per unit area of the luminous region. This allows the thickness of the first phosphor layer to be smaller than that of the second phosphor layer. Therefore, the first light-emitting device of the present invention can be produced easily. The amount of the paste may be determined in accordance with the thickness of the phosphor layer to be formed.

The paste may be obtained by dispersing a phosphor in a fluid resin such as a silicone resin or epoxy resin. The viscosity of the paste is generally about 50 to 5000 Pa·s, and preferably about 100 to 2000 Pa·s.

Although a method for applying the paste is not particularly limited, ink jet printing is preferred because it is easy to finely adjust the position at which the paste is applied. Screen printing also can be used for the application of the paste. In the case of screen printing, the paste may be applied to substantially the entire surface of the light-emitting element with a first screen plate, and then the paste further may be applied to a portion corresponding to the luminous region with a second screen plate. The first screen plate may have an opening pattern for applying the paste to substantially the entire surface of the light-emitting element. The second screen plate may have an opening pattern for applying the paste to only the portion corresponding to the luminous region. After the phosphor layer is formed by screen printing, the phosphor layer located on the nonluminous region may be ground. This method also can make the thickness of the first phosphor layer smaller than that of the second phosphor layer.

Next, the second method for manufacturing a light-emitting device of the present invention will be described. The second method is suitable for the manufacture of the second light-emitting device of the present invention. When the explanation of the second method overlaps with that of the second light-emitting device and the first method, it may be omitted in the following.

The second method of the present invention is a method for manufacturing a light-emitting device including a substrate, a light-emitting element that is mounted on the substrate and includes a luminous region and a nonluminous region, and a phosphor layer that is formed to cover the light-emitting element by the application of at least two types of pastes containing a phosphor. The second method includes applying a second paste to the nonluminous region and a first paste to the luminous region. The concentration of the phosphor of the second paste is lower than that of the phosphor of the first paste. This allows the concentration of the phosphor in the first phosphor layer to be lower than that of the phosphor in the second phosphor layer. Therefore, the second light-emitting device of the present invention can be produced easily. The concentrations of the phosphors of the first and second pastes may be determined, respectively, in accordance with the concentration of the phosphor in the phosphor layer to be formed.

In the second method of the present invention, although a method for applying the first and second pastes is not particularly limited, ink jet printing is preferred because it is easy to adjust finely the position at which the paste is applied. Hereinafter, embodiments of the present invention will be described in detail.

Embodiment 1

Figure 1B:
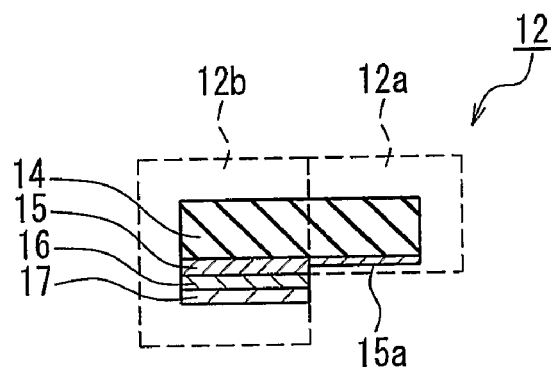
FIG. 1B is a cross-sectional view showing an LED chip included in the light-emitting device of FIG. 1A.
Figure 1C:
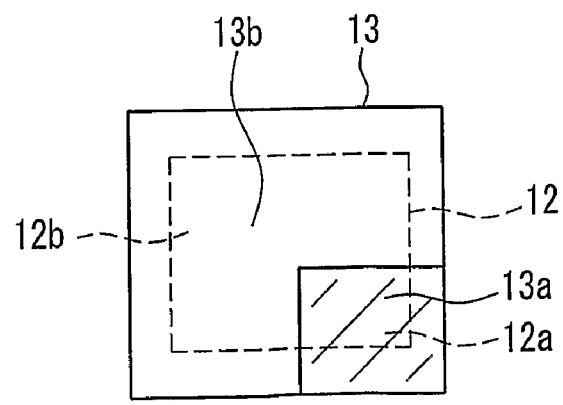
FIG. 1C is a top view showing a phosphor layer and the LED chip included in the light-emitting device of FIG. 1A.

A light-emitting device of Embodiment 1 of the present invention will be described with reference to the drawings. FIG. 1A is a cross-sectional view showing the light-emitting device of Embodiment 1. FIG. 1B is a cross-sectional view showing an LED chip included in the light-emitting device of FIG. 1A. FIG. 1C is a top view showing a phosphor layer and the LED chip included in the light-emitting device of FIG. 1A. The light-emitting device of Embodiment 1 is an example of the first light-emitting device of the present invention.

As shown in FIG. 1A, the light-emitting device 1 includes a substrate 10, a conductor pattern 11 that is formed on the substrate 10, an LED chip 12 that is flip-chip mounted on the conductor pattern 11, and a phosphor layer 13 that is formed to cover the LED chip 12 and includes a phosphor.

The LED chip 12 includes a sapphire substrate 14 and a first conductivity-type layer 15, a light-emitting layer 16, and a second conductivity-type layer 17 that are formed in this order on the sapphire substrate 14. The first conductivity-type layer 15 may be an n-type semiconductor layer such as an n-GaN layer. The second conductivity-type layer 17 may be a p-type semiconductor layer such as a p-GaN layer. The light-emitting layer 16 is not in contact with a portion 15a of the principle surface of the first conductivity-type layer 15 that faces the substrate 10, and the portion 15a is provided with a first electrode 18a. In other words, as shown in FIG. 1B, the LED chip 12 has a nonluminous region 12a including the portion 15a and a luminous region 12b including the light-emitting layer 16. Moreover, as shown in FIG. 1A, the first conductivity-type layer 15 is connected electrically to the conductor pattern 11 via the first electrode 18a and a gold bump 19. The second conductivity-type layer 17 is connected electrically to the conductor pattern 11 via a second electrode 18b and a gold bump 19.

In the light-emitting device 1, the thickness of a first phosphor layer 13a (see FIG. 1A) located on the nonluminous region 12a is smaller than that of a second phosphor layer 13b (see FIG. 1A) located on the luminous region 12b. This can reduce the amount of light (e.g., blue light) absorbed by the phosphor in the first phosphor layer 13a. Accordingly, as shown in FIG. 1C, the color of light emitted from the upper surface (with hatching) of the first phosphor layer 13a can match the color of light emitted from the upper surface (without hatching) of the second phosphor layer 13b. Thus, the light-emitting device 1 can suppress nonuniform luminescent color.

In the light-emitting device 1, the thickness of a first phosphor wall 13c (see FIG. 1A) located along the side of the nonluminous region 12a is smaller than that of a second phosphor wall 13d (see FIG. 1A) located along the side of the luminous region 12b. This also can suppress the color nonuniformity of light emitted from the sides of the phosphor layer 13.

Figure 2A:
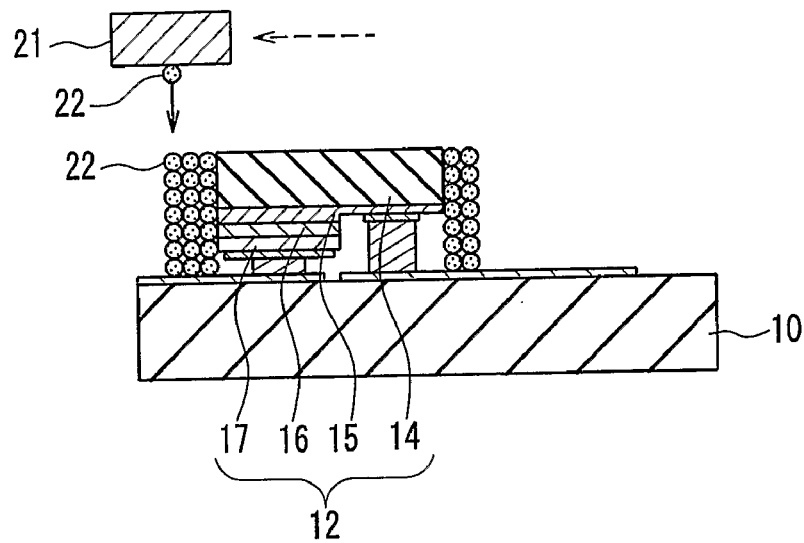
FIGS. 2A to 2C are cross-sectional views showing an example of a method for manufacturing a light-emitting device of Embodiment 1 of the present invention.
Figure 2B:
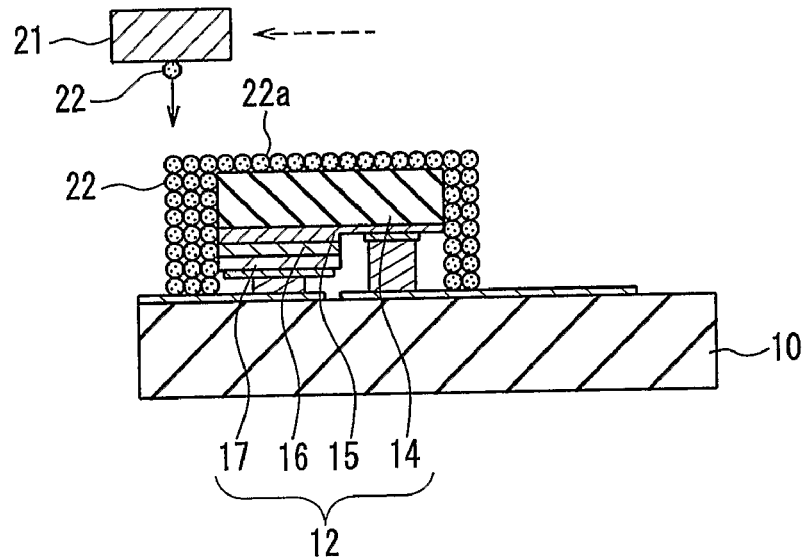
Figure 2C:
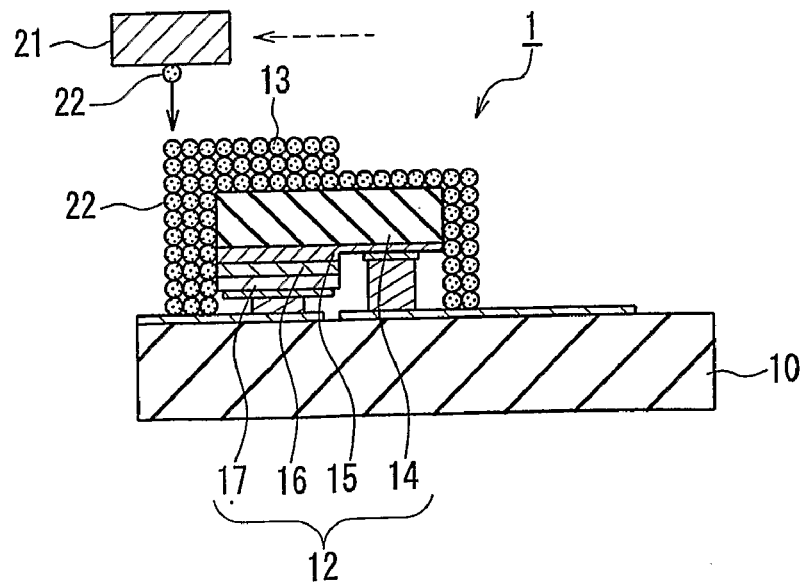

Next, an example of a method for manufacturing the light-emitting device 1 of Embodiment 1 will be described below. FIGS. 2A to 2C are cross-sectional views showing an example of the method for manufacturing the light-emitting device 1 of Embodiment 1. In the method of FIGS. 2A to 2C, the phosphor layer 13 of the light-emitting device 1 is formed by ink jet printing. In FIGS. 2A to 2C, the same components as those in FIGS. 1A to 1C are denoted by the same reference numerals, and the explanation will not be repeated.

First, as shown in FIG. 2A, a paste 22 containing a phosphor is discharged from a head 21 along the sides of the LED chip 12. The head 21 discharges the paste 22 in the form of droplets. The amount of the paste 22 applied to the side of the nonluminous region 12a (see FIG. 1B) of the LED chip 12 is smaller than that of the paste 22 applied to the side of the luminous region 12b (see FIG. 1B) of the LED chip 12. Consequently, the thickness of the first phosphor wall 13c (see FIG. 1A) is made smaller than that of the second phosphor wall 13d (see FIG. 1A).

Then, as shown in FIG. 2B, the paste 22 is discharged in the same manner as FIG. 2A on the LED chip 12 and the paste 22 that has been applied in the process of FIG. 2A.

Moreover, the paste 22 is discharged in the same manner as FIG. 2A on the paste 22 of a region 22a (see FIG. 2B) corresponding to the luminous region 12b (see FIG. 1B) of the LED chip 12, so that the phosphor layer 13 is formed (FIG. 2C), thus providing a light-emitting device 1.

Next, another example of a method for manufacturing the light-emitting device 1 of Embodiment 1 will be described below. FIGS. 3A to 3D are cross-sectional views showing another example of the method for manufacturing the light-emitting device 1 of Embodiment 1. In the method of FIGS. 3A to 3D, the phosphor layer 13 of the light-emitting device 1 is formed by screen printing. In FIGS. 3A to 3D, the same components as those in FIGS. 1A to 1C and 2A to 2C are denoted by the same reference numerals, and the explanation will not be repeated.

Figure 3A:
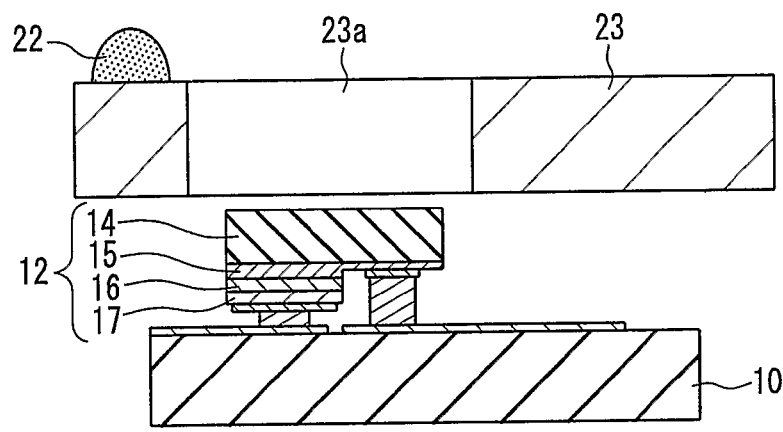
FIGS. 3A to 3D are cross-sectional views showing another example of a method for manufacturing a light-emitting device of Embodiment 1 of the present invention.
Figure 3B:
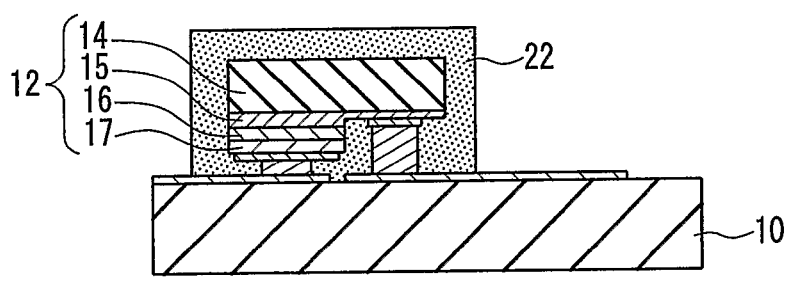

First, as shown in FIG. 3A, a first screen plate 23 with an opening pattern 23a is placed above the substrate 10. At this time, the opening pattern 23a is aligned with the LED chip 12. Then, the paste 22 is screen-printed from above the first screen plate 23, and the LED chip 12 is covered with the paste 22, as shown in FIG. 3B.

Figure 3C:
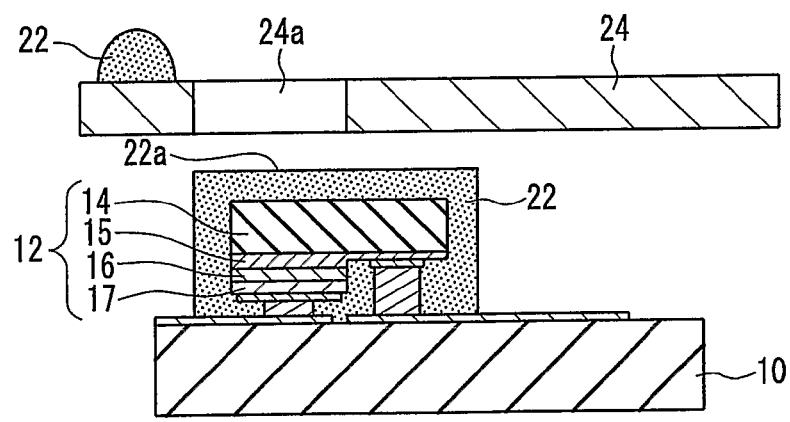
Figure 3D:
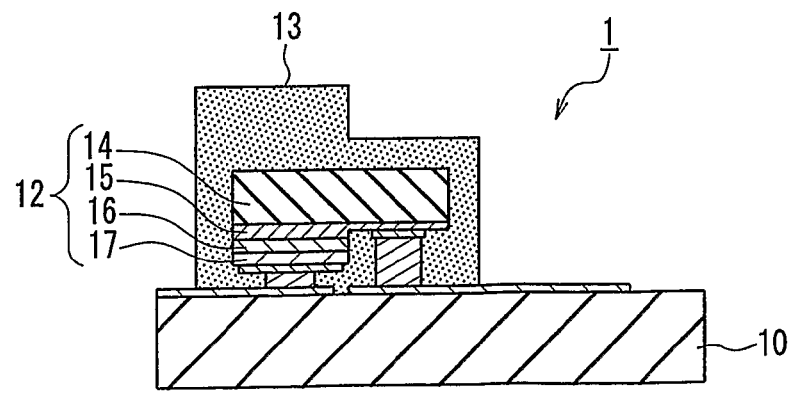

Subsequently, as shown in FIG. 3C, a second screen plate 24 with an opening pattern 24a is placed above the substrate 10. At this time, the opening pattern 24a is aligned with the region 22a corresponding to the luminous region 12b (see FIG. 1B) of the LED chip 12. Then, the paste 22 is screen-printed from above the second screen plate 24, so that the phosphor layer 13 is formed (FIG. 3D), thus providing a light-emitting device 1.

Figure 4A:
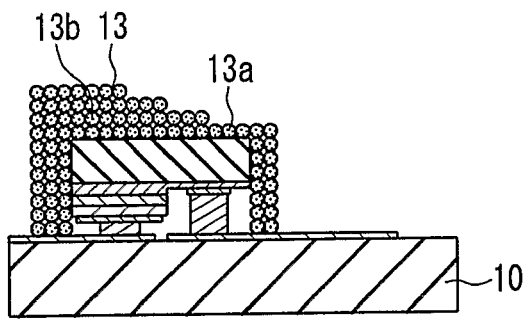
FIGS. 4A to 4J are cross-sectional views showing an example of the modification of a light-emitting device of Embodiment 1 of the present invention.
Figure 4B:
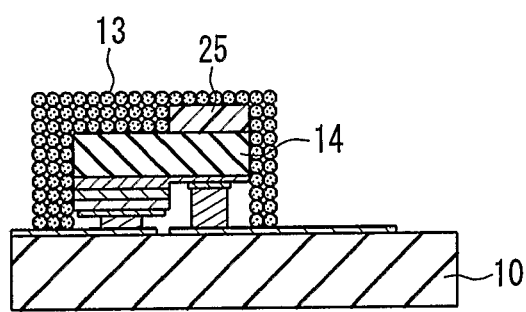
Figure 4C:
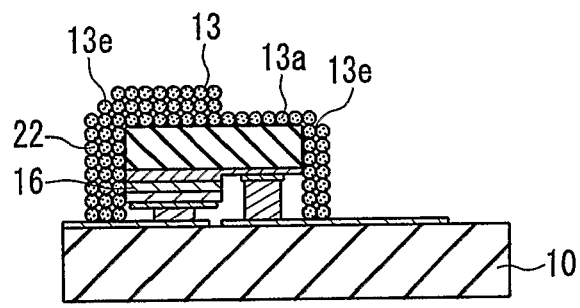

The light-emitting device of Embodiment 1 and the method for manufacturing it have been described above, but the first light-emitting device of the present invention is not limited to this embodiment. For example, as shown in FIG. 4A, the phosphor layer 13 may be formed so that the thickness is decreased stepwise from the second phosphor layer 13b to the first phosphor layer 13a. As shown in FIG. 4B, a transparent layer 25 made of glass or transparent resin such as a silicone resin, epoxy resin, or fluorocarbon resin may be formed on the surface of the sapphire substrate 14 in the nonluminous region 12a (see FIG. 1B), and then the phosphor layer 13 may be formed to cover the sapphire substrate 14 and the transparent layer 25 to a uniform height. Moreover, as shown in FIG. 4C, the amount of the paste 22 discharged may be smaller at the edge 13e than in the other portions of the phosphor layer 13. The shortest distance from the edge 13e of the phosphor layer 13 to the light-emitting layer 16 generally is longer than that from any other portions of the surface of the phosphor layer 13 to the light-emitting layer 16. Therefore, the light emitted, e.g., from the edge 13e of the phosphor layer 13 becomes yellow and is one of the reasons for nonuniform luminescent color. By discharging a smaller amount of the paste 22 at the edge 13e than in the other portions of the phosphor layer 13, as shown in FIG. 4C, the color of light emitted from the edge 13e of the phosphor layer 13 can match the color of light emitted from the other portions. The phosphor layer 13 in FIGS. 4A to 4C can be formed by ink jet printing.

Figure 4D:
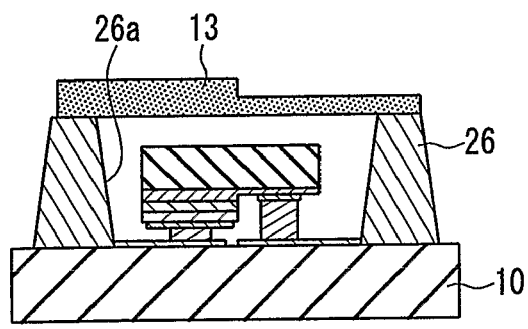

As shown in FIG. 4D, when a reflecting plate 26 is provided on the substrate 10 with a hollow 26a inside, a plate-like phosphor layer 13 may be put on the reflecting plate 26 so as to cover the hollow 26a. In this case, the thickness of the phosphor layer 13 located above the nonluminous region 12a (see FIG. 1B) can be decreased, e.g., by grinding the corresponding portion of the phosphor layer 13.

Figure 4E:
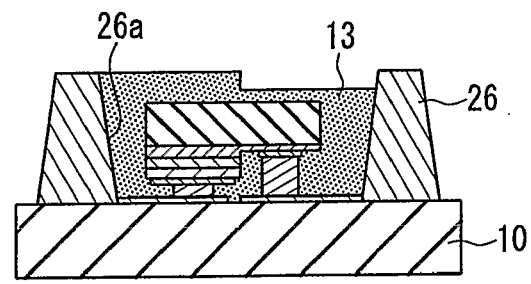

As shown in FIG. 4E, after the reflecting plate 26 is provided on the substrate 10, the phosphor layer 13 may be formed in the hollow 26a, e.g., by potting. Like the phosphor layer in FIG. 4D, the thickness of the phosphor layer 13 located on the nonluminous region 12a (see FIG. 1B) can be decreased, e.g., by grinding the corresponding portion of the phosphor layer 13.

Figure 4F:
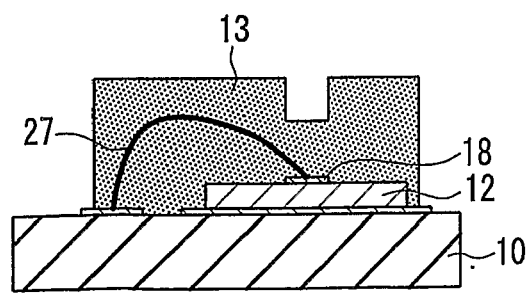
Figure 4G:
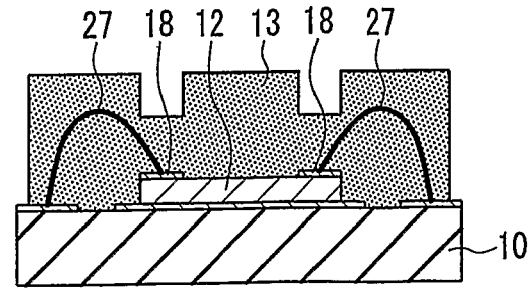

As shown in FIGS. 4F and 4G, an electrode 18 may be provided on the principal surface of the LED chip 12 facing the light extraction side, and the LED chip 12 may be mounted on the substrate 10 via the electrode 18 and a gold wire 27. In the light-emitting devices of FIGS. 4F and 4G, the nonluminous region of the LED chip 12 is where the electrode 18 is provided on the principle surface. Thus, the thickness of the phosphor layer 13 located directly above the electrode 18 can be decreased, e.g., by grinding or the like.

Figure 4H:
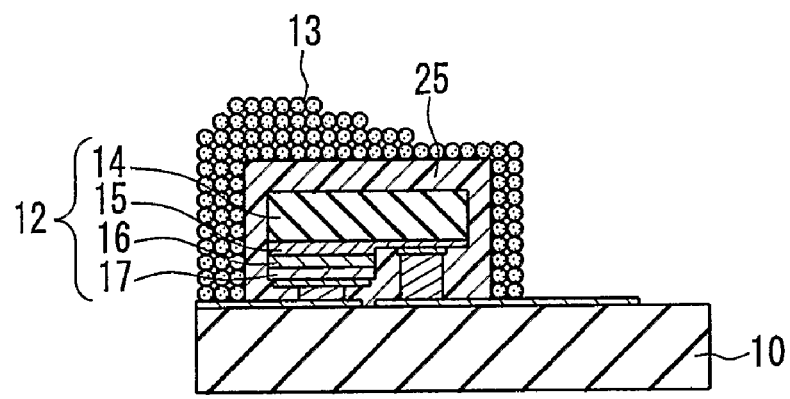
Figure 4I:
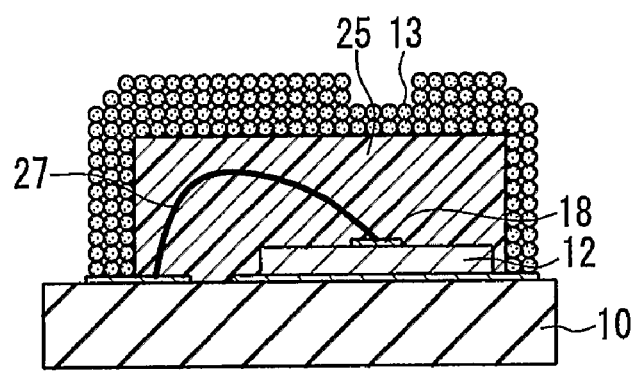
Figure 4J:
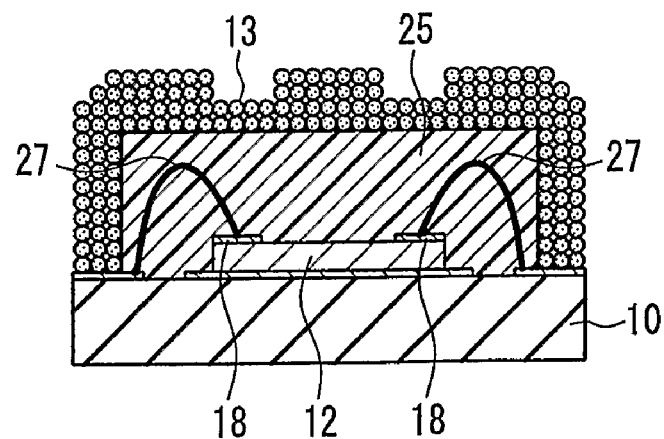

The light-emitting device also may have the configurations as shown in FIGS. 4H, 4I and 4J, which are modified examples of FIGS. 4A, 4F and 4G, respectively. In FIGS. 4H, 4I, and 4J, the transparent layer 25 is present between the LED chip 12 and the phosphor layer 13. These configurations can suppress nonuniform luminescent color and improve the light extraction efficiency.

Embodiment 2

Figure 5A:
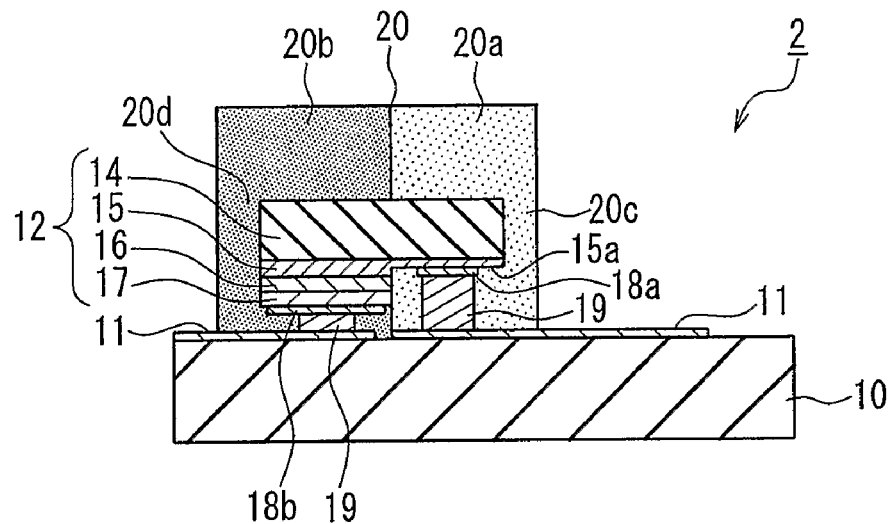
FIG. 5A is a cross-sectional view showing a light-emitting device of Embodiment 2 of the present invention.
Figure 5B:
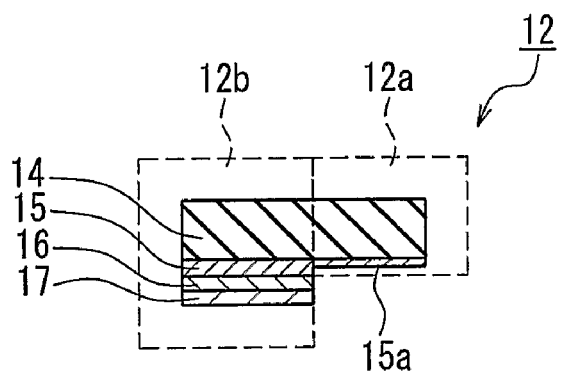
FIG. 5B is a cross-sectional view showing an LED chip included in the light-emitting device of FIG. 5A.
Figure 5C:
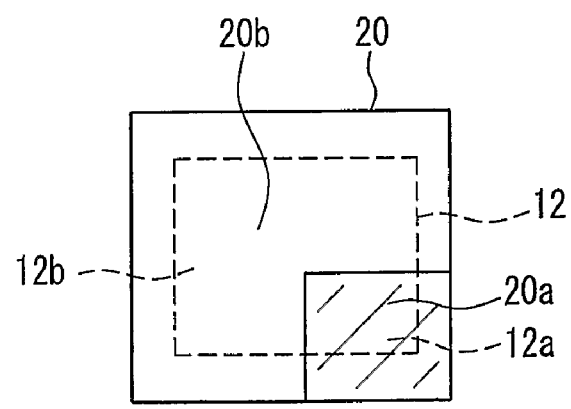
FIG. 5C is a top view showing a phosphor layer and the LED chip included in the light-emitting device of FIG. 5A.

A light-emitting device of Embodiment 2 of the present invention will be described with reference to the drawings. FIG. 5A is a cross-sectional view showing the light-emitting device of Embodiment 2. FIG. 5B is a cross-sectional view showing an LED chip included in the light-emitting device of FIG. 5A. FIG. 5C is a top view showing a phosphor layer and the LED chip included in the light-emitting device of FIG. 5A. The light-emitting device of Embodiment 2 is an example of the second light-emitting device of the present invention. In FIGS. 5A to 5C, the same components as those in FIGS. 1A to 1C are denoted by the same reference numerals, and the explanation will not be repeated.

As shown in FIG. 5A, the light-emitting device 2 of Embodiment 2 differs from the light-emitting device 1 (see FIG. 1A) of Embodiment 1 only in the phosphor layer. In a phosphor layer 20 of the light-emitting device 2, the concentration of the phosphor in a first phosphor layer 20a located on the nonluminous region 12a (see FIG. 5B) is lower than that of the phosphor in a second phosphor layer 20b located on the luminous region 12b (see FIG. 5B). This can reduce the amount of light (e.g., blue light) absorbed by the phosphor in the first phosphor layer 20a. Accordingly, as shown in FIG. 5C, the color of light emitted from the upper surface (with hatching) of the first phosphor layer 20a can match the color of light emitted from the upper surface (without hatching) of the second phosphor layer 20b. Thus, the light-emitting device 2 can suppress nonuniform luminescent color.

In the light-emitting device 2, the concentration of the phosphor in a first phosphor wall 20c is lower than that of the phosphor in a second phosphor wall 20d. This also can suppress the color nonuniformity of light emitted from the sides of the phosphor layer 20.

Figure 6A:
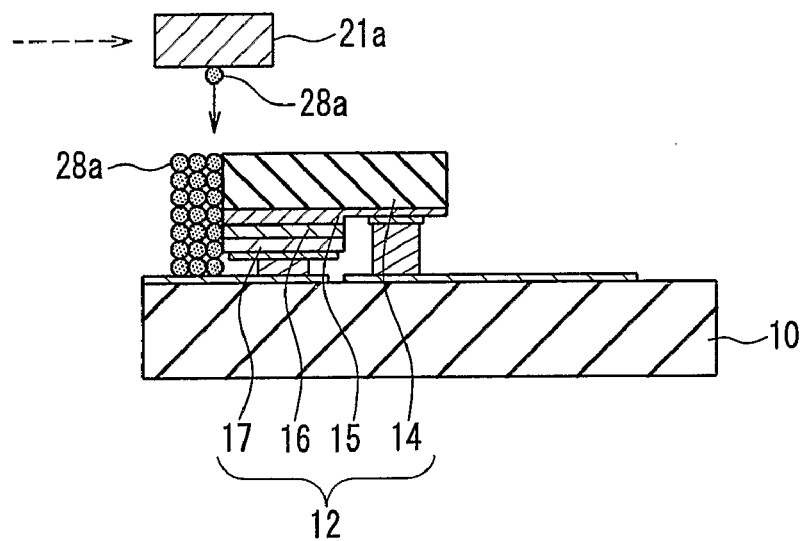
FIGS. 6A to 6C are cross-sectional views showing an example of a method for manufacturing a light-emitting device of Embodiment 2 of the present invention.
Figure 6B:
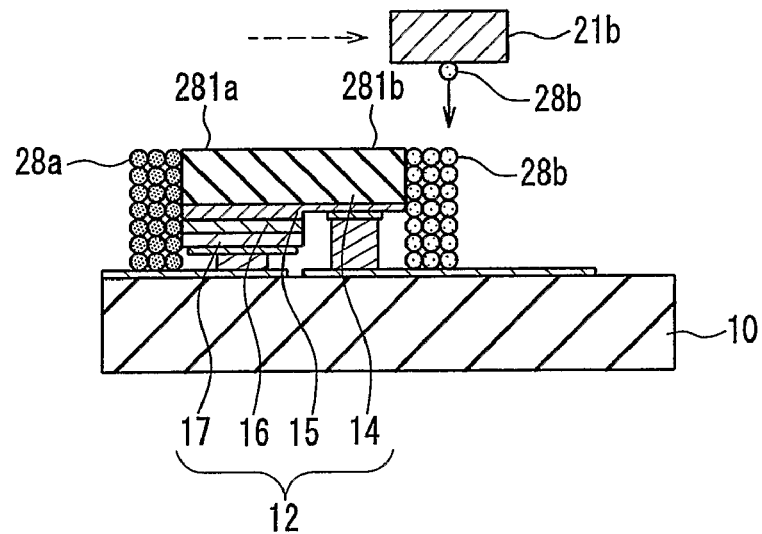
Figure 6C:
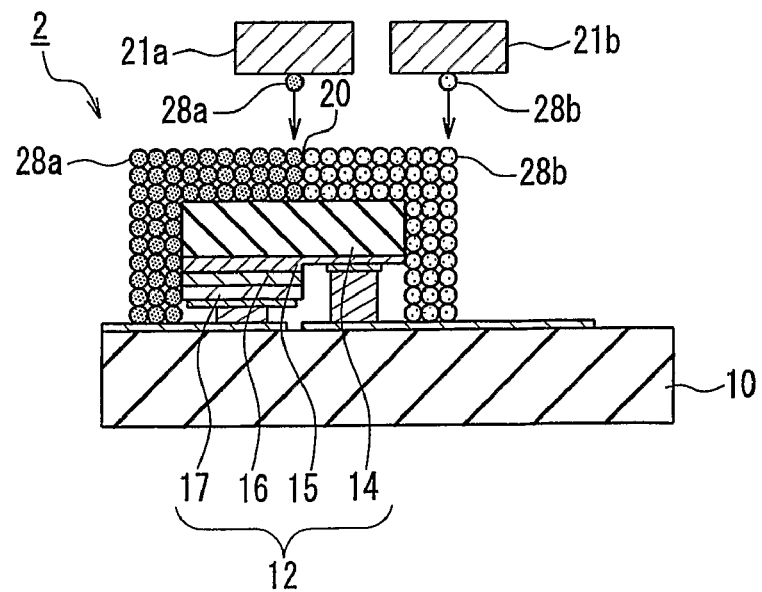

Next, an example of a method for manufacturing the light-emitting device 2 of Embodiment 2 will be described below. FIGS. 6A to 6C are cross-sectional views showing an example of the method for manufacturing the light-emitting device 2 of Embodiment 2. In the method of FIGS. 6A to 6C, the phosphor layer 20 of the light-emitting device 2 is formed by ink jet printing. In FIGS. 6A to 6C, the same components as those in FIGS. 5A to 5C are denoted by the same reference numerals, and the explanation will not be repeated.

First, as shown in FIG. 6A, a first paste 28a containing a phosphor is discharged from a first head 21a along the side of the luminous region 12b (see FIG. 5B) of the LED chip 12.

Then, as shown in FIG. 6B, a second paste 28b containing a phosphor is discharged from a second head 21b along the side of the nonluminous region 12a (see FIG. 5B) of the LED chip 12. The concentration of the phosphor of the second paste 28b is lower than that of the phosphor of the first paste 28a.

Moreover, the first paste 28a is discharged in the same manner as FIG. 6A on a region 281a (see FIG. 6B) corresponding to the luminous region 12b (see FIG. 5B) of the LED chip 12, and the second paste 28b is discharged in the same manner as FIG. 6B on a region 281b (see FIG. 6B) corresponding to the nonluminous region 12a (see FIG. 5B) of the LED chip 12, so that the phosphor layer 20 is formed (FIG. 6C), thus providing a light-emitting device 2. The phosphors of the first and second pastes 28a, 28b may be either the same or different. When two or more types of phosphors are used in combination, the component ratio of the phosphors for the first paste 28a may differ from the second paste 28b.

Figure 7:
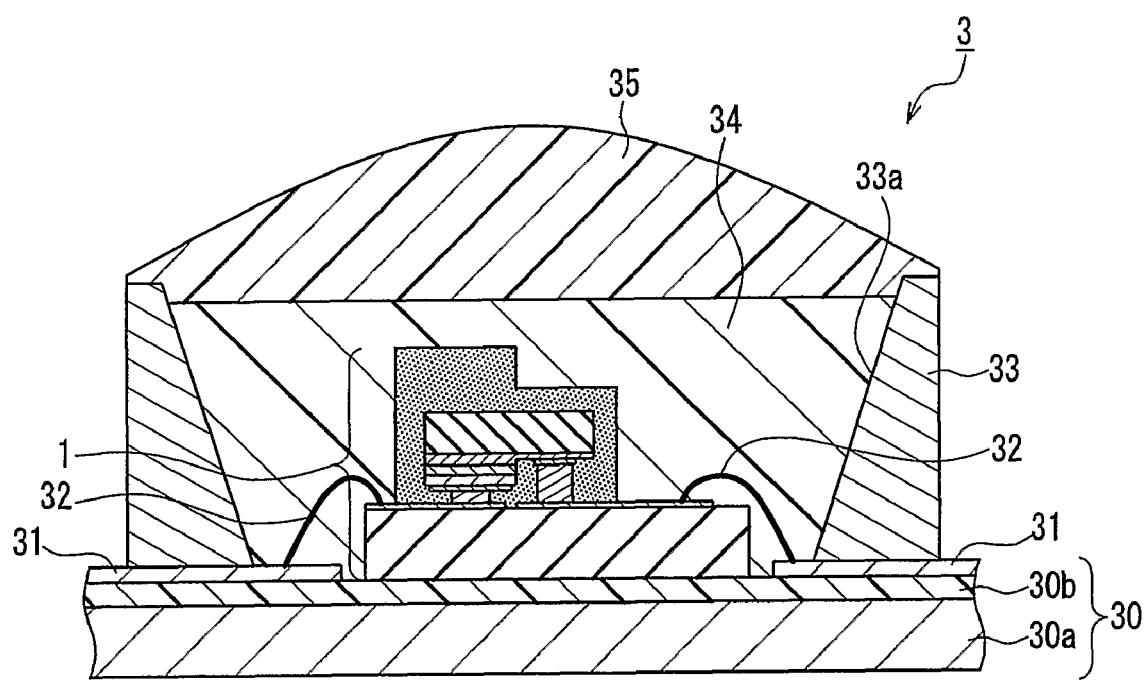
FIG. 7 is a cross-sectional view showing a light-emitting module using a light-emitting device of Embodiment 1 of the present invention.

Next, a light-emitting module using the light-emitting device 1 (see FIG. 1A) of Embodiment 1 will be described by referring to the drawings. FIG. 7 is a cross-sectional view showing the light-emitting module. In FIG. 7, the same components as those in FIGS. 1A to 1C are denoted by the same reference numerals, and the explanation will not be repeated.

As shown in FIG. 7, the light-emitting module 3 includes the following: a mounting board 30; a wiring pattern 31 formed on the mounting board 30; a plurality of light-emitting devices 1 (although FIG. 7 shows only one of them) mounted on the wiring pattern 31 via gold wires 32; a reflecting plate 33 provided on the mounting board 30 with a hollow 33a inside; a sealing resin layer 34 formed in the hollow 33a for sealing the light-emitting device 1; and a lens 35 formed on the sealing resin layer 34. The mounting board 30 includes a metal layer 30a made of aluminum or the like and an electric insulating layer 30b formed on the metal layer 30a. As the electric insulating layer 30b, e.g., a composite material including 70 to 95 mass % of inorganic filler and 5 to 30 mass % of thermosetting resin composition can be used.

The light-emitting module 3 with this configuration includes the light-emitting device 1 of the present invention and thus can suppress nonuniform luminescent color. In the light-emitting module 3, the sealing resin layer 34 and the lens 35 may be formed of glass or transparent resin such as a silicone resin or epoxy resin. The material of the reflecting plate 33 may be, e.g., metal having a high reflectance such as aluminum or a ceramic material having a high reflectance such as alumina. In FIG. 7, the light-emitting device 1 of Embodiment 1 is used, but the light-emitting device 2 of Embodiment 2 also can be used as well.

Embodiment 3

Figure 8:
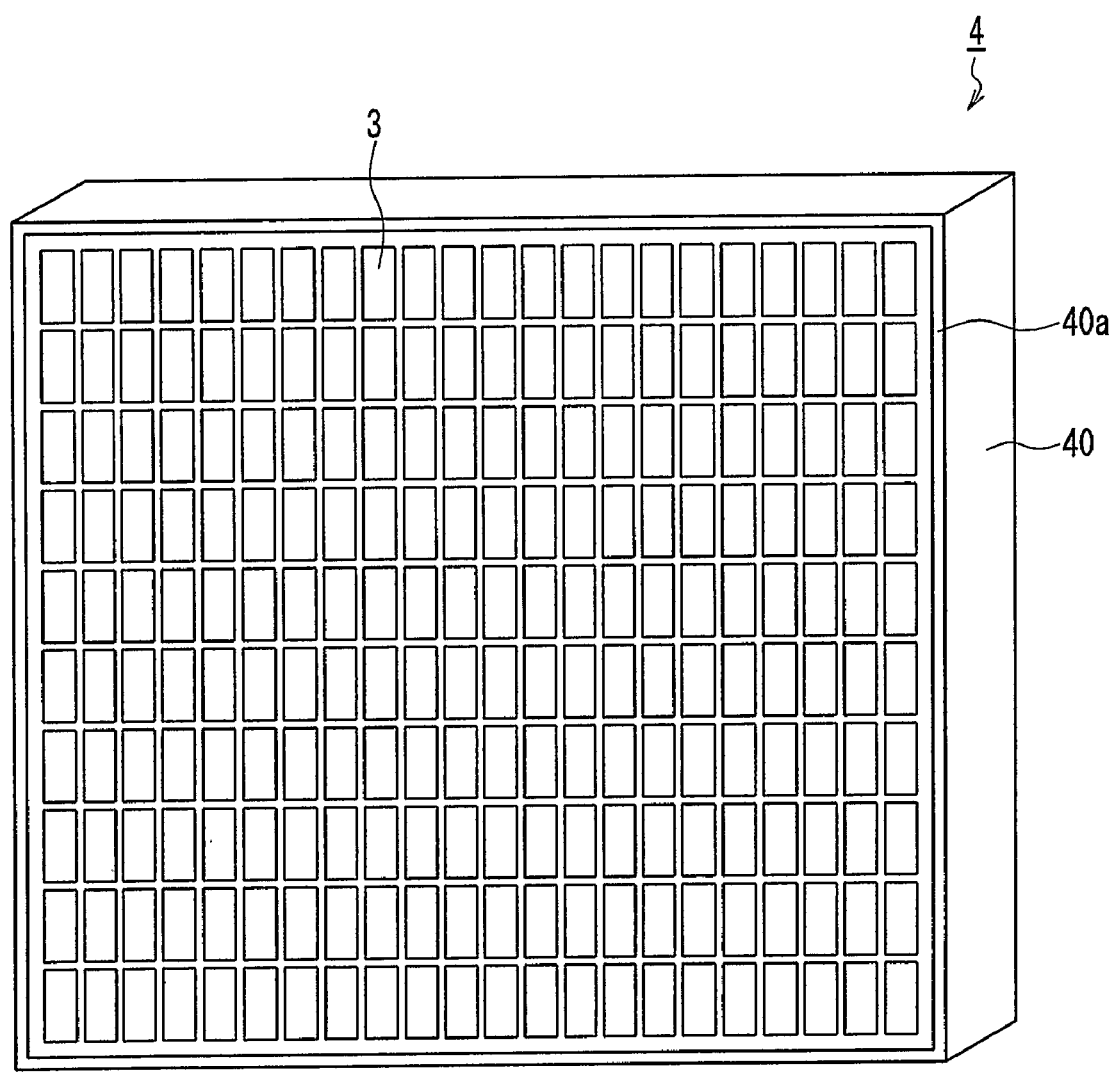
FIG. 8 is a perspective view showing a display unit (image display apparatus) of Embodiment 3 of the present invention.

A display unit of Embodiment 3 of the present invention will be described by referring to the drawings. FIG. 8 is a perspective view showing the display unit (image display apparatus) of Embodiment 3.

As shown in FIG. 8, the image display apparatus 4 of Embodiment 3 includes a panel 40. A plurality of light-emitting modules 3 are arranged in a matrix form on a principal surface 40a of the panel 40 as light sources. The image display apparatus 4 with this configuration uses the light-emitting modules 3, each of which includes the light-emitting device 1 of the present invention, as light sources and thus can suppress nonuniform luminescent color.

Embodiment 4

Figure 9:
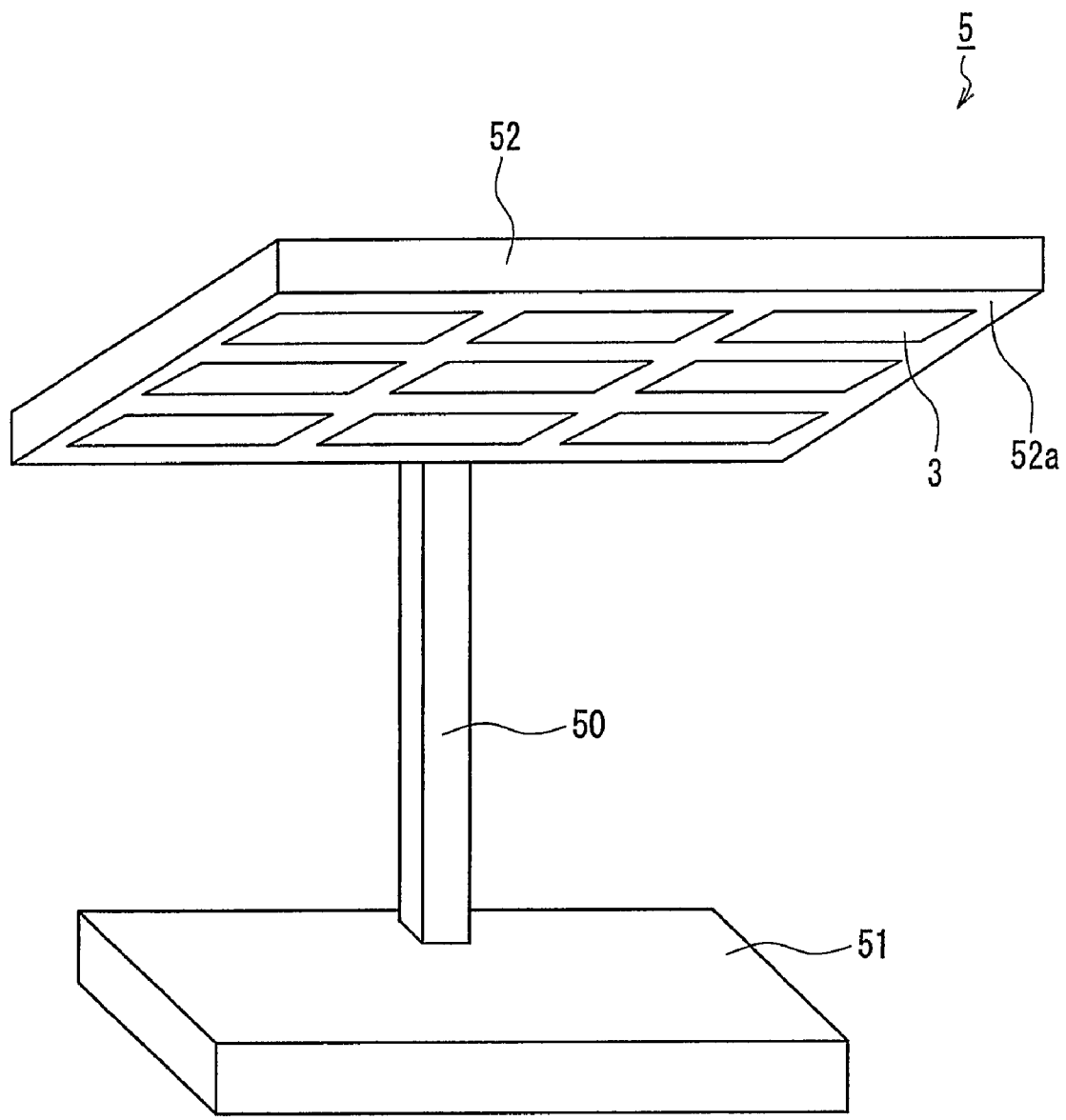
FIG. 9 is a perspective view showing a lighting unit (desk-top lamp) of Embodiment 4 of the present invention.

A lighting unit of Embodiment 4 of the present invention will be described by referring to the drawings. FIG. 9 is a perspective view showing the lighting unit (desktop lamp) of Embodiment 4.

As shown in FIG. 9, the desktop lamp 5 of Embodiment 4 includes a neck 50, a base 51 that is fixed at one end of the neck 50 for supporting the neck 50, and a lighting portion 52 that is fixed at the other end of the neck 50. A plurality of light-emitting modules 3 are arranged in a matrix form on a principal surface 52$a$ of the lighting portion 52 as light sources. The desktop lamp 5 with this configuration uses the light-emitting modules 3, each of which includes the light-emitting device 1 of the present invention, as light sources and thus can suppress nonuniform luminescent color.

EXAMPLES

Hereinafter, examples of the present invention will be described. However, the present invention is not limited to the examples.

Example 1 of the present invention produced a light-emitting device 1 of FIG. 1A by the method as shown in FIGS. 2A to 2C. In Example 1, the thicknesses of the first and second phosphor layers 13$a$, 13$b$ were 90 μm and 140 μm, respectively. The concentration of the phosphors in both the first and second phosphor layers 13$a$, 13$b$ was 70 mass %.

Example 2 of the present invention produced a light-emitting device 2 of FIG. 5A by the method as shown in FIGS. 6A to 6C. In Example 2, the thickness of both the first and second phosphor layers 20$a$, 20$b$ was 140 μm. The concentrations of the phosphors in the first and second phosphor layers 20$a$, 20$b$ were 45 mass % and 70 mass %, respectively.

Examples 1 and 2 used a GaN LED having a thickness (maximum thickness) of 70 μm and an area of 0.1 mm$^2$ as the LED chip 12.

Comparative Example produced a light-emitting device with the same configuration as Examples 1 and 2, except that the thicknesses of the first and second phosphor layers were the same (140 μm), and the concentrations of the phosphors in the first and second phosphor layers also were the same (70 mass %).

Evaluation of Nonuniformity of Luminescent Color

Nonuniformity of luminescent color of each of the light-emitting devices of Example 1, Example 2, and Comparative Example was evaluated in the following manner.

Figure 10A:
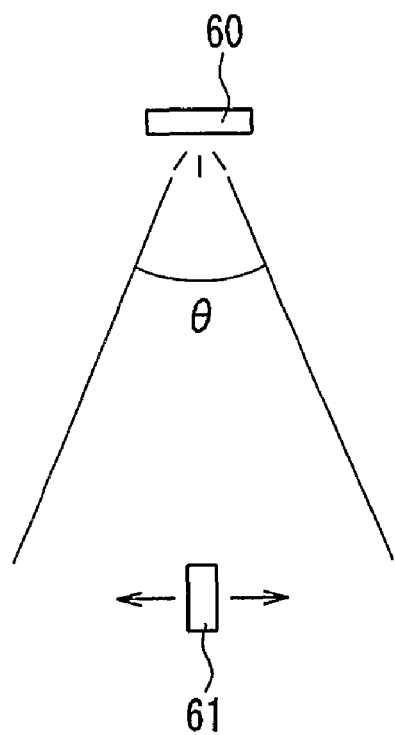
FIG. 10A is a schematic view showing a method for evaluating the nonuniformity of luminescent color.
Figure 10B:
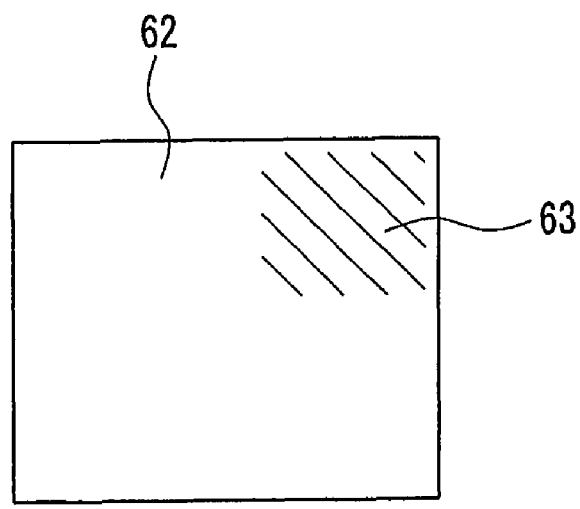
FIG. 10B is a plan view showing a virtual irradiation plane used in the evaluation method of FIG. 10A.

FIG. 10A is a schematic view showing a method for evaluating the nonuniformity of the luminescent color. As shown in FIG. 10A, a light source 60 was formed by attaching a lens to each of the light-emitting devices of Example 1, Example 2, and Comparative Example. Then, a current (30 mA) was applied to the light source 60, so that the light source 60 emitted light. In this case, the beam angle θ was 20 degrees. A plane that was perpendicular to the optical axis of the light source 60 and located 50 cm away from the light source 60 was defined as a virtual irradiation plane. A probe 61 was arranged in the virtual irradiation plane to measure the spectrum of light from the light source 60. As shown in FIG. 10B, which is a plan view of the virtual irradiation plane, the spectrum was measured at two regions: a region 62 that was irradiated with the light emitted from the second phosphor layer; and a region 63 that was irradiated with the light emitted from the first phosphor layer. The spectral measurement was performed with MCPD 3000 (manufactured by Otsuka Electronics Co., Ltd.).

Figure 11A:
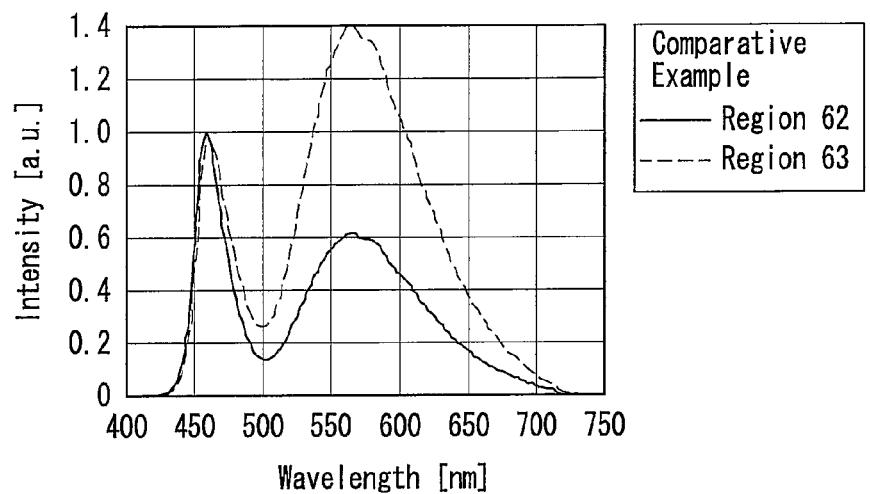
FIGS. 11A to 11C are graphs indicating a spectrum of light emitted from a light source.
Figure 11B:
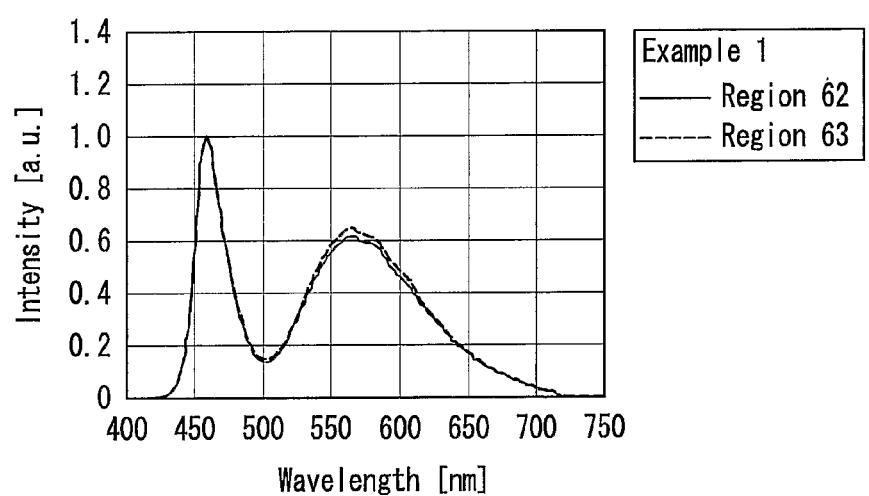
Figure 11C:
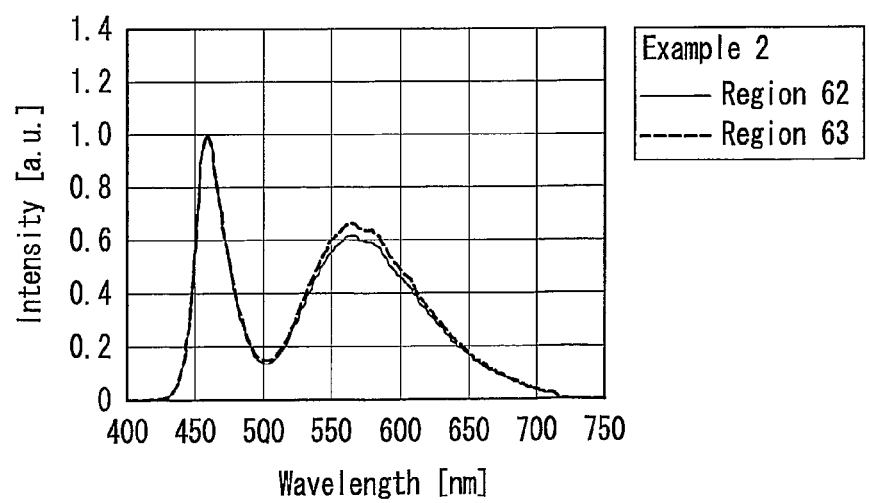
Figure 12A:
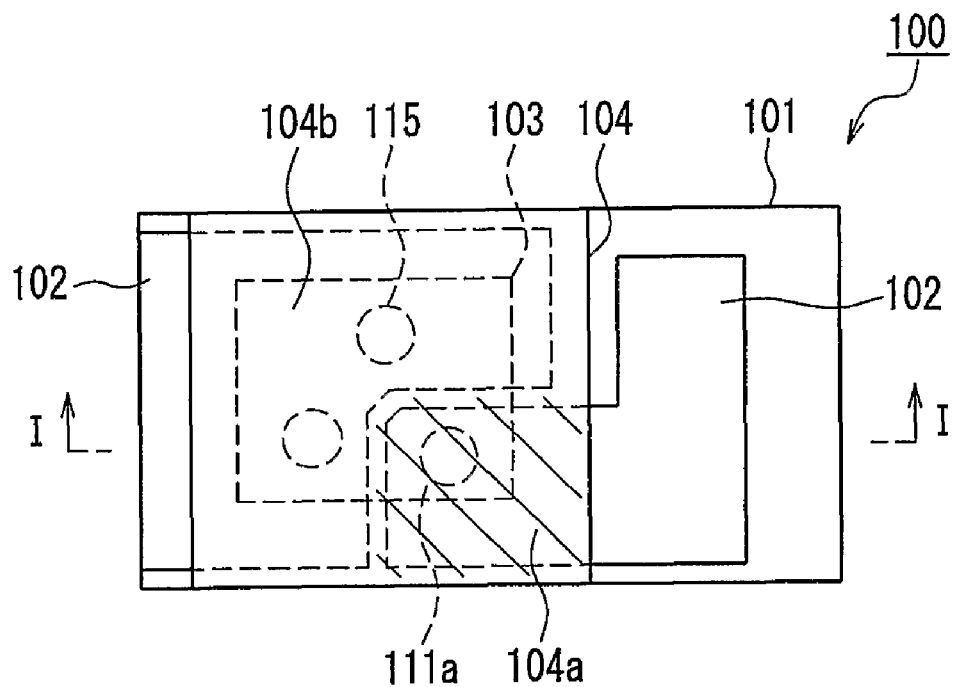
FIG. 12A is a schematic top view showing a conventional light-emitting device.
Figure 12B:
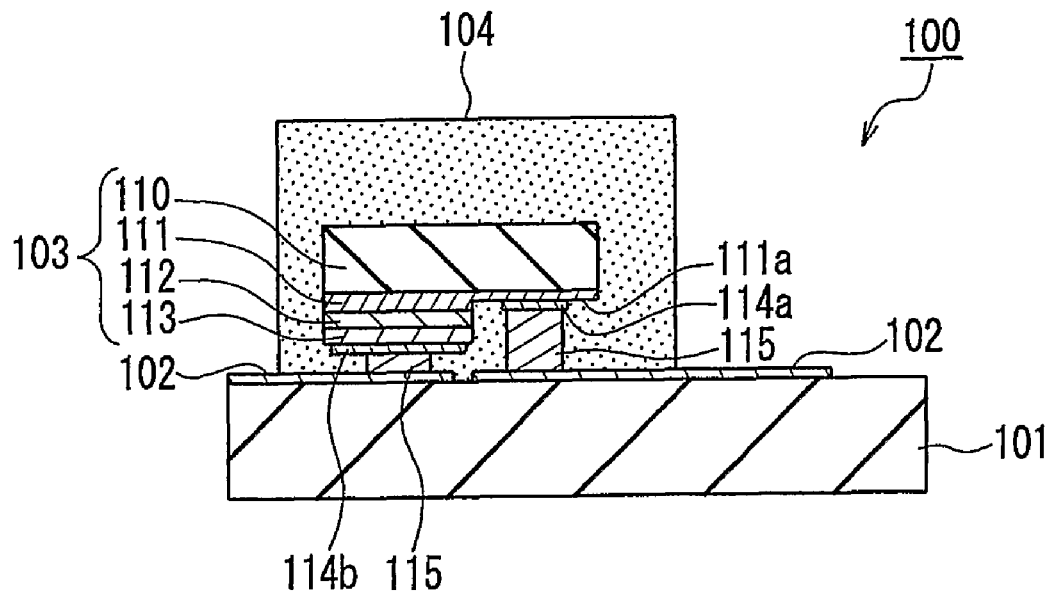
FIG. 12B is a cross-sectional view taken along the line I-I in FIG. 12A.

FIGS. 11A to 11C are graphs indicating the spectrum of light from the light source 60. FIG. 11A shows Comparative Example, FIG. 11B shows Example 1, and FIG. 11C shows Example 2. In FIGS. 11A to 11C, the solid line represents the spectral shape of light in the region 62 (see FIG. 10B), and the broken line represents the spectral shape of light in the region 63 (see FIG. 10B). In order to facilitate comparison, the intensity of light (blue light) with a wavelength of 460 nm was standardized as 1 in FIGS. 11A to 11C.

As shown in Comparative Example of FIG. 11A, the spectral shape (solid line) of light in the region 62 differed considerably from the spectral shape (broken line) of light in the region 63. In Comparative Example, the blue light component (with a wavelength of about 460 nm) of light emitted from the surface of the first phosphor layer was smaller than the yellow light component (with a wavelength of about 570 nm) of the light. Therefore, the light in the region 63 was observed as yellow light, resulting in such a difference between the spectral shapes in FIG. 11A.

On the other hand, as shown in Examples 1 and 2 of FIGS. 11B and 11C, the spectral shape (solid line) of light in the region 62 coincided substantially with the spectral shape (broken line) of light in the region 63. Thus, it is clear from the result that Examples 1 and 2 of the present invention can suppress nonuniform luminescent color.

INDUSTRIAL APPLICABILITY

A light-emitting device of the present invention is suitable for a lighting unit used, e.g., in general lighting applications, lighting for presentation purposes (such as a sign light), or vehicle lighting (particularly a headlight) or a display unit used, e.g., in outdoor large display screens, backlights, or projectors.

The invention claimed is:

1. A light-emitting device, comprising:
   a substrate;
   a light-emitting element that is mounted on the substrate and comprises a luminous region and a nonluminous region; and
   a phosphor layer that is formed to cover the light-emitting element and includes a phosphor,
   wherein a thickness of the phosphor layer located on the nonluminous region is smaller than that of the phosphor layer located on the luminous region,
   the thickness of the phosphor layer located on the luminous region is constant,
   the thickness of the phosphor layer located on the nonluminous region is constant,
   a surface of the phosphor layer located on the luminous region is flat, and
   a surface of the phosphor layer located on the nonluminous region is flat,
   wherein the thickness of the phosphor layer located on the nonluminous region is $\frac{1}{3}$ to $\frac{2}{3}$ of the thickness of the phosphor layer located on the luminous region,
   wherein the thickness of the phosphor layer located on the nonluminous region is 60 to 100 μm and the thickness of the phosphor layer located on the luminous region is 100 to 150 μm.

2. The light-emitting device according to claim 1, wherein a thickness of a sidewall of the phosphor layer located along a side of the nonluminous region is smaller than that of a sidewall of the phosphor layer located along a side of the luminous region.

3. The light-emitting device according to claim 1, wherein the light-emitting element is flip-chip mounted on the substrate.

4. The light-emitting device according to claim 1, wherein the nonluminous region includes a region where an electrode is provided.

5. A display unit comprising the light-emitting device according to claim 1.

6. A lighting unit comprising the light-emitting device according to claim 1.

7. A light-emitting device, comprising:
    a substrate;
    a light-emitting element that is mounted on the substrate and comprises a luminous region and a nonluminous region; and
    a phosphor layer that is formed to cover the light-emitting element and includes a phosphor,
    wherein a concentration of the phosphor in the phosphor layer located on the nonluminous region is lower than that of the phosphor in the phosphor layer located on the luminous region,
    a thickness of the phosphor layer located on the luminous region being the same as a thickness of the phosphor layer located on the nonluminous region,
    a surface of the phosphor layer located on the luminous region is flat, and
    a surface of the phosphor layer located on the nonluminous region is flat,
    wherein the concentration of the phosphor in the phosphor layer located on the nonluminous region is ⅓ to ⅔ of the concentration of the phosphor in the phosphor layer located on the luminous region,
    wherein the concentration of the phosphor included in the phosphor layer located on the nonluminous region is 40 to 46 mass % of the phosphor layer, and
    wherein the concentration of the phosphor included in the phosphor layer located on the luminous region is 60 to 70 mass % of the phosphor layer.

8. The light-emitting device according to claim 7, wherein a concentration of the phosphor in a sidewall of the phosphor layer located along a side of the nonluminous region is lower than that of the phosphor in a sidewall of the phosphor layer located along a side of the luminous region.

9. The light-emitting device according to claim 7, wherein the light-emitting element is a flip-chip mounted on the substrate.

10. The light-emitting device according to claim 7, wherein the nonluminous region includes a region where an electrode is provided.

11. A display unit, comprising the light-emitting device according to claim 7.

12. A lighting unit, comprising the light-emitting device according to claim 7.

* * * * *